(12) United States Patent
Mark et al.

(10) Patent No.: US 8,084,704 B2
(45) Date of Patent: Dec. 27, 2011

(54) SWITCH FOR A BRUSH WEAR RECORDING CIRCUIT

(75) Inventors: Bernhard Mark, Waldshut (DE); Max Hobelsberger, Wuerenlingen (CH)

(73) Assignee: Alstom Technology Ltd, Baden (CH)

( * ) Notice: Subject to any disclaimer, the term of this patent is extended or adjusted under 35 U.S.C. 154(b) by 427 days.

(21) Appl. No.: 12/429,664

(22) Filed: Apr. 24, 2009

(65) Prior Publication Data

US 2009/0266700 A1    Oct. 29, 2009

(30) Foreign Application Priority Data

Apr. 25, 2008    (EP) .................................... 08155159

(51) Int. Cl.
    *H03K 17/975* (2006.01)

(52) U.S. Cl. ........ 200/600; 310/242; 310/245; 310/248; 310/249

(58) Field of Classification Search .................. 200/600; 310/242, 245, 248–249
    See application file for complete search history.

(56) References Cited

U.S. PATENT DOCUMENTS

| | | | |
|---|---|---|---|
| 2,193,172 A | | 3/1940 | Hills |
| 4,272,695 A | | 6/1981 | Buchwald et al. |
| 4,344,009 A | * | 8/1982 | Reynolds ...................... 310/242 |
| 4,348,608 A | | 9/1982 | Michael |
| 4,381,302 A | * | 4/1983 | Huff et al. ..................... 514/250 |
| 4,451,786 A | | 5/1984 | Sawada et al. |
| 4,488,078 A | | 12/1984 | Orton |
| 5,285,035 A | | 2/1994 | Williams et al. |
| 6,933,650 B2 | * | 8/2005 | Wang ............................. 310/245 |
| 7,923,892 B2 | * | 4/2011 | Mark et al. .................... 310/242 |

FOREIGN PATENT DOCUMENTS

| | | |
|---|---|---|
| CA | 1194112 | 9/1985 |
| DE | 560 232 C | 9/1932 |
| DE | 30 31 915 A1 | 4/1982 |
| DE | 3417711 | 11/1985 |
| DE | 86 00 934 U1 | 4/1986 |
| DE | 8600934 | 4/1986 |
| DE | 195 21 702 A1 | 2/1996 |
| DE | 196 19 733 A1 | 11/1997 |
| DE | 19758235 | 4/1999 |
| DE | 102 57 621 A1 | 7/2004 |
| EP | 0 360 197 A | 3/1990 |

(Continued)

OTHER PUBLICATIONS

European Search Report for EP 08155159 mailed Dec. 30, 2008.

(Continued)

*Primary Examiner* — Xuong Chung Trans
(74) *Attorney, Agent, or Firm* — Leydig, Voit & Mayer, Ltd.

(57) ABSTRACT

A switch for a brush wear monitoring recording circuit for monitoring wear of at least one brush, the switch having an open and a closed state, comprises a fixed part including a switch plate having a switch face and a moving part including a capacitive flag disposed on a brush so as to move the capacitive flag corresponding to a brush wear movement in a brush wear direction and a capacitive plate having a capacitive face, wherein the capacitive face and the switch face are disposed parallel to each other and provide capacitance to the switch, and further wherein the capacitive flag is disposed on the brush so as to bring the capacitive face and the switch face in proximity to each other so as to face each other and increase capacitance, thereby changing the switch state.

11 Claims, 2 Drawing Sheets

FOREIGN PATENT DOCUMENTS

| | | |
|---|---|---|
| EP | 1801938 | 6/2007 |
| GB | 1215649 | 12/1970 |
| GB | 1 488 837 A | 10/1977 |
| GB | 1564384 | 4/1980 |
| GB | 2300311 | 10/1996 |
| JP | 6141513 | 5/1994 |
| JP | 07274445 | 10/1995 |
| SU | 1 403 169 A | 6/1988 |

OTHER PUBLICATIONS

Co-pending U.S. Appl. No. 12/429,627, filed Apr. 24, 2009, entitled "Brush wear monitor".

Co-pending U.S. Appl. No. 12/429,764, filed Apr. 24, 2009, entitled "Switch for a brush wear recording circuit".

Search report from EP 2 112 519 A3 published on Nov. 4, 2009.

* cited by examiner

SWITCH FOR A BRUSH WEAR RECORDING CIRCUIT

Priority is claimed to European Patent Application No. EP 08155159.0, filed on Apr. 25, 2008, the entire disclosure of which is incorporated by reference herein.

The disclosure relates to brushes used for transferring current in electrical machines such as electric motors or alternators, and more specifically to brushes designed to preferentially wear. More particularly the invention relates to switches used in recording circuits that identify critical brush wear.

BACKGROUND

Brush gear mechanisms are used extensively in certain motors, generators and other rotating electrical machinery to conduct current between stationary and rotating parts (commutators or slip rings). To avoid or at best minimise the wear of the rotating parts, which are typically constructed of copper or brass, brushes are made of soft materials, such as carbon and graphite, so as to preferentially wear. It is important that brush wear is monitored to ensure that the brushes do not wear beyond a minimum level as a completely worn brush can lead to electrical arcing resulting in machine part failure.

One established method of monitoring brush wear is to install brush assemblies in brush houses with visual inspection means to enable operator inspection. Due to human factors however machine failures still occur. For other reasons, including cost reduction, it maybe desirable to at least supplement such monitoring with automated monitoring. As a result, instrumented brush-monitoring systems have been developed.

Monitoring of the excitation voltage supplying a brush is one known method of monitoring brush wear. For example GB1564384 provides a process of monitoring the signature of the excitation voltage for unusual, high-energy noise spikes created by brush arcing. It does this by using sensors connected to each brush while using comparative algorithms and filtering means to analysis the data. U.S. Pat. No. 4,451,786 and CA 1194112 also teach of similar methods with similar disadvantages including that a fault condition i.e. arcing but not brush wear, is monitored making the method reactive rather than preventative. Further disadvantages include the fact that monitoring involves complex signature filtering and interpretation and so is open to error. The methods also inherently lack the ability to utilize one sensor to monitor multiple brushes.

JP6141513 provides another brush monitoring method that utilizes brush electrical signatures while relying only on the input of armature current and an armature revolution count to calculate brush wear. As the method does not directly measure or detect brush wear the accuracy of the method is limited and, despite analyses simplicity, still requires a sensor per monitored brush.

Larger machines typically have 30 or more brushes and therefore to improve inherent monitoring reliability and simplify maintenance and installation it is advantageous for these systems to have as few sensors as possible. The requirement for the cited teaches to have a sensor per monitored brush therefore disadvantages all the above teachings.

DE 3417711 A1 provides another brush wear monitoring system capable of monitoring the wear of multiple brushes. The switching arrangement of the system is mounted on each brush holder and comprises a swivelled lever that is biased onto the brush. The lever further comprises a contact that when the brush wears, moves towards a brush holder, holding the brush, by the swivel motion of the level. When the brush wears to a certain point the contact contacts the brush holder. This has the effect of closing the brush wear recording circuit so by enabling the triggering of a brush wear alarm.

DE 86 00 934 U1 provides another brush wear monitoring system capable of monitoring the wear of multiple brushes by using a swivel arm that swivels with the wear movement of the brush so as to close a switch at a brush wear point.

DE 197 58 235 A1 provides another brush wear monitoring system comprising of a rod mounted on a brush. The system uses the principle of a sensor detecting a source mounted on the rod as the rod is moved by brush wear. The source is disclosed as being a magnetised ring and the sensor either a magnetic-hydraulic sensor or an optical-hydraulic sensor.

SUMMARY OF THE INVENTION

An aspect of the invention is to provide an improved switch for triggering a wear brush alarm for an electrical machine.

The invention is based on the general idea of capacitance switching to identify a worn brush by a flag mounted on a brush. This switch has the advantage that the switching recording circuit is physically independent of the brush circuit and the switching is not affected by foulant commonly found in brush housings in which brush are mounted as physical contact is not required. Accordingly, one aspect provides a switch for a brush wear monitoring recording circuit wherein the switch has a capacitance and an open and closed state. The switch has a fixed part and a moving part. The fixed part has a switch plate that has a face while the moving part comprises a capacitive flag, mounted on a brush such that the capacitive flag moves with the wear movement of the brush in the brush wear direction, and includes a capacitive plate that has a face. The capacitive plate face and switch plate face are essentially parallel to each other while the mounting of the capacitive flag on the brush is such that brush wear brings the faces in proximity to each other so as to face each other thereby increasing the capacitance between the plates so by changing the switch state.

In one aspect, the capacitive plate face and the switch plate face are essentially parallel to the brush wear direction.

In another aspect, the capacitive flag is insulated from the brush, and the switch forms part of an AC powered recording circuit that has a detection device. The detection device is configured to detect changes in the switch state by the detection of a frequency stemming from the power to the recording circuit and influenced by the capacitance of the switch.

In a further aspect, the switch comprises two switch plates that form two ends of the switch and two capacitive plates mounted on a brush, configured and arranged on the brush so as to interposition between the two switch plates by brush wear. The interpositioning increases the capacitance between the plates. Typically the capacitive flag further includes a conducting plate that joins the two capacitive plates and is configured to provide electrical continuity between the capacitive plates through its material of construction.

In another embodiment, the brush, in use, has a brush voltage with a frequency component and the capacitive flag mounted on the brush is in electrical communication with the brush. The switch forms part of a recording circuit, which has a detection device that detects switch state changes by detecting the frequency component of the brush voltage influenced by the capacitance of the switch.

In a further embodiment, the switch consists of a plurality of capacitive flags, each with one capacitive plate, separately mounted oil a brush and one switch plate. Typically the one switch plate is sized and the plurality of capacitive plates arranged relative to the switch plate such that any one of the plurality of capacitive plates is capable of changing the switch state.

In another aspect either the or each capacitive plate, the or each switch plate or both the or each capacitive plate and the or each switch plate is covered by insulation. This prevents contact between the switch plate and capacitive, either by arrangement or by bridging by foulant. In this way the reliability of the switch is improved.

In a further aspect the surface area of the or each capacitive plate face is >200 mm$^2$ and typically <2500 mm$^2$. This ensures that the plates of the switch are sized large enough to ensure adequate capacitance for switching, but not so large as that they cannot fit in the confined space of a brush housing.

Other objectives and advantages of the present invention will become apparent from the following description, taken in connection with the accompanying drawings wherein by way of illustration and example, exemplary embodiments of the invention are disclosed.

BRIEF DESCRIPTION OF THE DRAWINGS

By way of example, an embodiment of the invention is described more fully hereinafter with reference to the accompanying drawings, in which.

DETAILED DESCRIPTION

Figure 1:
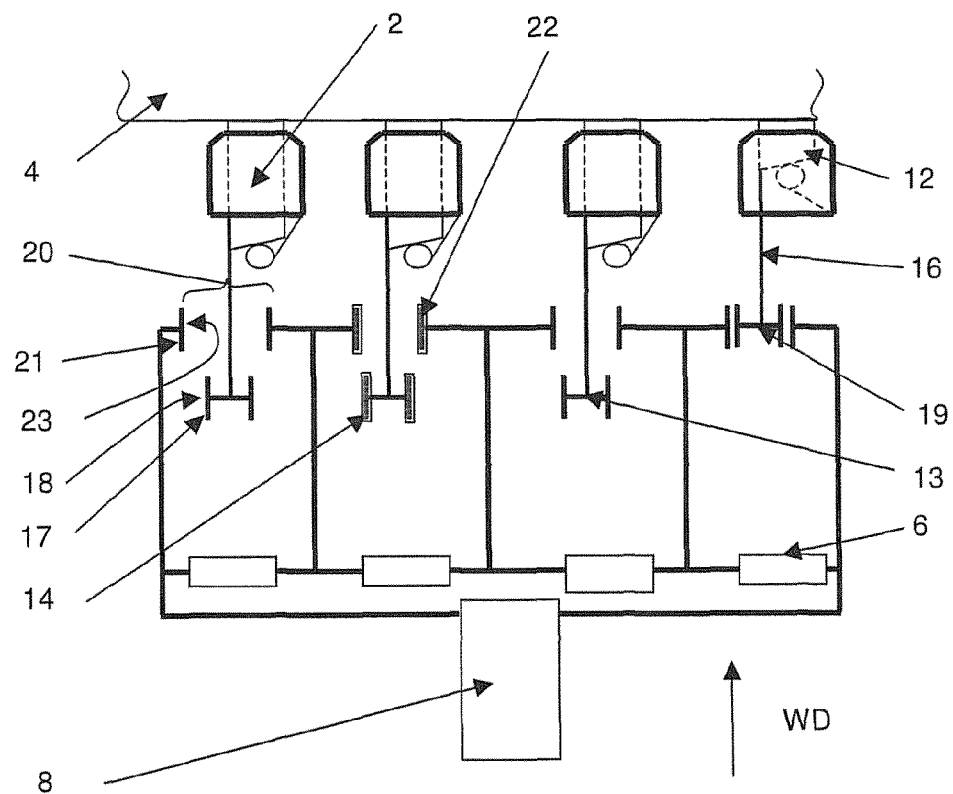
FIG. 1 is a schematic view of a brush monitoring system of the invention with multiple capacitance switches.

Preferred embodiments of the present invention are now described with reference to the drawings, wherein like reference numerals are used to refer to like elements throughout. In the following description, for purposes of explanation, numerous specific details are set forth in order to provide a thorough understanding of the invention. It may be evident, however, that the invention may be practiced without these specific details.

Figure 3:
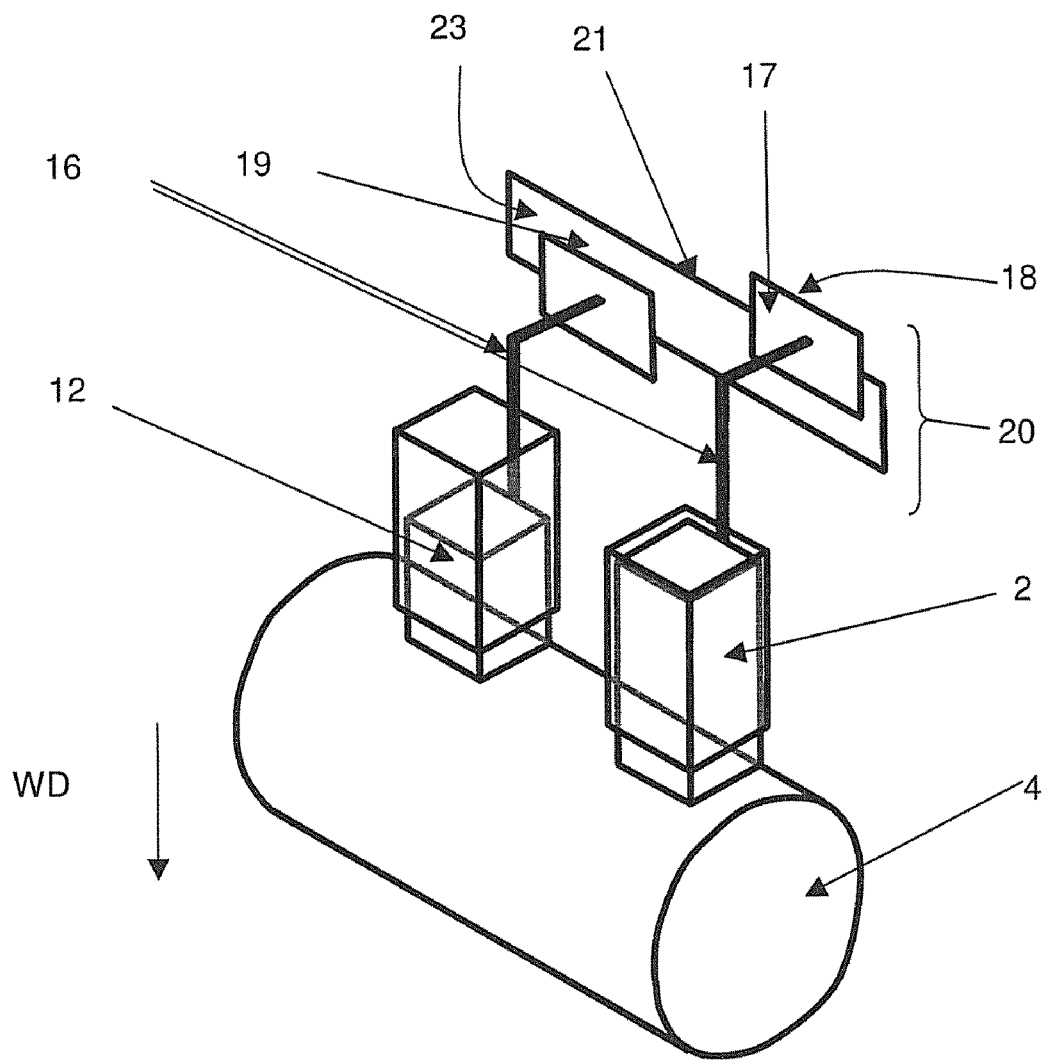
FIG. 3 is a schematic view of another exemplary capacitance switch arrangement.

FIGS. 1 and 3 shows exemplary embodiments of a switch 20 suitable for use in a brush wear recording circuit. The switch 20 comprises a fixed part and a moving part. The fixed part comprises a switch plate 21 that has a face 23 while the moving part comprises a capacitive flag 13, mounted on a brush 2, typically via a brush hook 16. The capacitive flag 13 further has a capacitive plate 17 with a face 18. As a brush 2 wears, the length of the brush 2 decreases causing the mounted capacitive flag 13 to move with the wear movement of the brush 2 in the direction of i.e. towards the rotating part of the electrical machine 4. In this specification, this direction is referred to as the brush wear direction WD. In an exemplary embodiment, the faces 18, 23 of the capacitive plate 17 and switch plate 21 respectively are parallel to each other and typically parallel to the brush wear direction WD. As used herein, parallel is understood to mean essentially parallel. As the brush 2 wears to a predetermined brush wear point the brush wear aligns the face 18 of a capacitive plate 17 with the face 23 of a switch plate 21 such that the faces 18, 23, face each other. This measurably increases the capacitance between the switch plate 21 and capacitive plate 17 enabling detection wherein the detection can be flagged as a change in switch state by a detection device 8 that preferably initiates a brush wear alert. As the capacitance of the switch 20 is dependent oil the displacement of the switch plate 21 from the capacitive plate 17 the change in switch state from open to closed and visa versa is not defined by a fixed, relative location between the plates 17,21 but rather a selected arbitrary capacitance value.

FIG. 1 shows an exemplary recording circuit that may also be applied to the exemplary embodiment shown in FIG. 3. The exemplary recording circuit is but one suitable recording circuit for initiating a brush wear alert. Other recording circuits could incorporate the exemplified switches 20 and provide the same brush wear alert. Typically, the recording circuit includes, in addition to a switch 20, an impedance device 6 and a detection device 8 wherein the detection device 8 identifies changes in the state of the switch 20. In an exemplary embodiment, as shown in FIG. 1, the recording circuit contains a plurality of switches 20 so by enabling the monitoring of multiple brushes 2 by a single recording circuit. In an exemplary embodiment, the capacitive plates 13 are insulated from brush voltage and the recording circuit is an AC powered circuit. In this arrangement the detection device 8 detects a frequency stemming from the powering of the recording circuit and influenced by the capacitance of the switch 20 to initiate a brush wear alert. In this way the recording circuit is independent of the brush voltage and electrical machine circuit.

The switch 20 of the exemplary embodiment shown in FIG. 1 comprises two switch plates 21 that form two ends of the switch 20 while the capacitive flag 13 has two capacitive plates 17. The plates 17,21 and flags 13 are arranged such that each switch plate 21 is paired to a capacitive plate 17 wherein the faces 18,23 of each paired plates 17,21 are substantially parallel to each other. The substantially parallel nature of the faces 18, 23 enables contact less interpositioning of capacitive flags 13 between switch plates 21 enabling a tight gap tolerance between facing switch plate 21 and capacitive plate 17 faces 23,18 so by providing a measurable capacitance of the switch 20.

Figure 2:
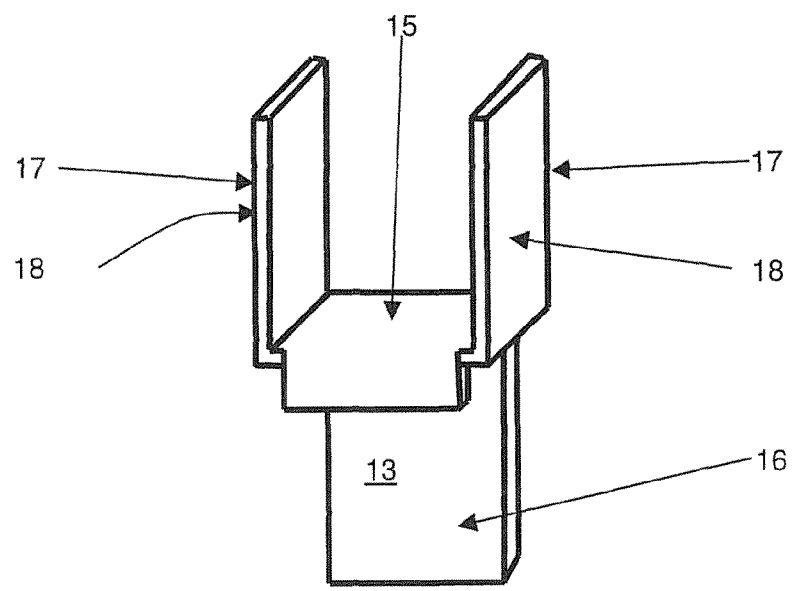
FIG. 2 is a detailed view of a capacitive brush flag of the monitoring system of FIG. 1.

FIG. 2 shows an expanded view of the capacitive flag 13 of the exemplary embodiment shown in FIG. 1. The capacitive flag 13 comprises two capacitive plates 17 joined by a conducting plate 15 wherein the conducting plate 15 provides electrical continuity between the capacitive plates 17 and serves the secondary purpose of being a mounting plate for attaching the conductive flag 18 to a brush hook 16.

In an exemplary embodiment, shown in FIG. 3 the switch 20, in its simplest form, comprises one switch plate 21 and a capacitive flag 13. The capacitive flag 13 is mounted on a brush 2, typically via a brush hook 16, and has only one capacitive plate 17. In an exemplary embodiment, the switch comprises one switch plate 21 and a plurality of capacitive flags 13 (i.e. capacitive plates 17 connected to brush hooks 16) each mounted on a separate brush 2 wherein the switch plate 21 is sized and the capacitive plates 17 of the capacitive flags 13 arranged relative to the switch plate 21 such any of the capacitive flags 13 are capable of changing the switch state. Typically this is achieved by the switch plate 21 being elongated in a direction perpendicular to the brush wear direction WD such that it extends past the wear position of the plurality of capacitive flag faces 18. Other arrangements and configurations of the single switch plate 21 and plurality of capacitive flags 13 could also provide the capacitive switching of the exemplary embodiment shown in FIG. 3.

In an exemplary embodiment of the switch 20 shown in FIG. 3 the capacitive flag(s) 13 are in electrically communication with the brush 2 wherein a change in switch state occurs when a detection device 8, shown for example in FIG. 1, detects a frequency component of the brush voltage influenced by the capacitance of the switch 20.

The surface area and separation distance of the plates 17,21 of the switch 20 and capacitive flag 13 defines the capacitance of the switch 20 wherein the optimum configuration and workable size of the plates is a compromise between these two factors. For installation reasons, it is preferable that plate size be kept to a minimum due to the confined space of a brush housing (not shown) but this reduces switch capacitance. To compensate for this plate gap can be narrowed but only by a limited amount. A suitable compromise is achieved in an exemplary embodiment when the surface area of the capacitive plate face 18 that faces a switch plate face 23, when a brush 2 is worn, is preferably >200 mm$^2$ more preferably >700 mm$^2$ and most preferably >1000 mm$^2$. To prevent interfere with the workings of the brushes 2 however, the maximum capacitive plate 17 area is preferably no greater than 1500 mm$^2$ although in some arrangements it can be as large as 2500 mm$^2$.

In an exemplary embodiment, either the switch plates 21 or capacitive plates 17, or both the switch plates 22 and capacitive plates 14 are covered by insulation. An example of a plates covered with insulation 14,22 is shown in FIG. 1. The insulation prevents, plate 14,22 contact and, bridging of the gap between the plates 14,22 of a closed switch 19 with conductive fouling medium commonly found in housings (not shown) in which brush assemblies are typically located, both of which interfere with the capacitance of the switch 20

Although the invention has been herein shown and described in what is conceived to be the most practical and preferred embodiment, it is recognized that departures can be made within the scope of the invention, which is not to be limited to details described herein but is to be accorded the full scope of the appended claims so as to embrace any and all equivalent devices and apparatus.

REFERENCE NUMBERS

2 Brush
4 Rotating machine part
6 Impedance device
8 Detection device
12 Worn brush
13 Capacitive flag
14 Capacitive plate covered with insulation
15 Conducting plate
16 Brush hook
17 Capacitive plate
18 Capacitive plate face
19 Closed switch
20 Switch
21 Switch plate
22 Switch plates covered with insulation
23 Switch plate face
WD Brush wear direction

What is claimed is:

1. A switch for a brush wear monitoring recording circuit for monitoring wear of at least one brush, the switch having an open and a closed state, comprising:
a fixed part including a switch plate having a switch face; and
a moving part including a capacitive flag disposed on a brush so as to move the capacitive flag corresponding to a brush wear movement in a brush wear direction, the capacitive flag including a capacitive plate having a capacitive face, wherein the capacitive face and the switch face are disposed parallel to each other and provide capacitance to the switch, and further wherein the capacitive flag is disposed on the brush so as to bring the capacitive face and the switch face in proximity to each other so as to face each other and increase capacitance, thereby changing the switch state.

2. The switch as recited in claim 1, wherein the capacitive face and the switch face are parallel to the brush wear direction.

3. The switch as recited in claim 1, wherein at least one capacitive plate is insulated from a brush voltage and the switch is configured to form part of an AC-powered recording circuit having a detection device configured to detect changes in the switch state by detection of a frequency derived powering of the recording circuit and influenced by a switch capacitance.

4. The switch as recited in claim 1, wherein the switch includes two switch plates forming two ends of the switch, and wherein the capacitive flag includes two capacitive plates configured to move toward a position between the two switch plates as brush wear increases, so as to increase a capacitance between the switch plates and the capacitive plates.

5. The switch as recited in claim 4, wherein the capacitive flag further includes a conducting plate joining the two capacitive plates and configured to provide electrical continuity between the capacitive plates.

6. The switch as recited in claim 1, wherein the brush has a brush voltage with a frequency component, wherein the capacitive flag is in electrical communication with the brush, and wherein the detection device is configured to detect the switch state change by detecting the frequency component of the brush voltage influenced by the capacitance of the switch.

7. The switch as recited in claim 6, wherein the brush wear monitoring recording circuit is configured to monitor the wear of a plurality of brushes, wherein the moving part includes a plurality of capacitive flags, each having one capacitive plate and each disposed separately on one of the plurality of blushes, wherein the plurality of capacitive plates are arranged relative to the sized switch plate such that any one of the plurality of capacitive plates is configured to change the switch state.

8. The switch as recited in claim 1, wherein at least one of the at least one capacitive plate and the at least one switch plate is covered by insulation.

9. The switch as recited in claim 8, wherein a surface area of the capacitive face is >200 mm$^2$.

10. The switch as recited in claim 9, wherein the surface area of the capacitive face is <2500 mm$^2$.

11. The switch as recited in claim 4, wherein the surface area of the two capacitive faces is >200 mm$^2$.

* * * * *